(12) United States Patent (10) Patent No.: US 7,388,438 B2
Hasegawa (45) Date of Patent: Jun. 17, 2008

(54) ΣΔ MODULATOR FOR PLL CIRCUIT

(75) Inventor: Morihito Hasegawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 695 days.

(21) Appl. No.: 11/042,136

(22) Filed: Jan. 26, 2005

(65) Prior Publication Data

US 2005/0153662 A1 Jul. 14, 2005

(51) Int. Cl.
*H03L 7/18* (2006.01)
*H03M 3/00* (2006.01)

(52) U.S. Cl. .......................................... 331/16; 341/143

(58) Field of Classification Search ................ 331/1 A, 331/16, 18, 25; 327/156–159; 332/127; 341/143; 360/51; 375/376; 455/260
See application file for complete search history.

(56) References Cited

U.S. PATENT DOCUMENTS 7,075,384 B2 * 7/2006 Tamura ...................... 332/127

FOREIGN PATENT DOCUMENTS

| JP | 6-244721 | 9/1994 |
| JP | 8-321775 | 12/1996 |
| JP | 2003-23351 | 1/2003 |
| WO | WO 99/31807 | 6/1999 |

* cited by examiner

*Primary Examiner*—David Mis
(74) *Attorney, Agent, or Firm*—Arent Fox LLP

(57) ABSTRACT

A ΣΔ modulator for producing a modulation signal for modulating a frequency division ratio of a comparison frequency divider of a PLL circuit. A plurality of integrators connected in series integrate an input signal and output overflow signals when the integrated value has exceeded a predetermined value. Differentiators transfer the overflow signals of the integrators. An adder multiplies predetermined coefficients by output signals output from the differentiators and adds the multiplied values. The absolute values of the predetermined coefficients of the adder are set to be less than the predetermined value. This setting decreases the modulation width of the modulation signal.

18 Claims, 14 Drawing Sheets

| n-6 | n-5 | n-4 | n-3 | n-2 | n-1 | n | n+1 | n+2 | n+3 | n+4 | n+5 | n+6 |
|---|---|---|---|---|---|---|---|---|---|---|---|---|
| 0 | 0 | 0 | 0 | 0 | 0 | 1 | 0 | -2 | 0 | 2 | 0 | -2 |
| 0 | 0 | 0 | 0 | 0 | 1 | 0 | -1 | 0 | 0 | 0 | 0 | 0 |
| 0 | 0 | 0 | 0 | 1 | 0 | 0 | 0 | -1 | 0 | 0 | 0 | 0 |
| 0 | 0 | 0 | 1 | 0 | 1 | 0 | -1 | 0 | -1 | 0 | 0 | 0 |
| 0 | 0 | 1 | 0 | 2 | 0 | 0 | 0 | -2 | 0 | -1 | 0 | 0 |
| 0 | 1 | 0 | 3 | 0 | 2 | 0 | -2 | 0 | -3 | 0 | -1 | 0 |
| 1 | 0 | 4 | 0 | 5 | 0 | 0 | 0 | -5 | 0 | -4 | 0 | -1 |
| 0 | 5 | 0 | 9 | 0 | 5 | 0 | -5 | 0 | -9 | 0 | -5 | 0 |

⇐ Start Condition

4th Order
span=10kHz

3rd Order
span=10kHz ations No. PCT/JP2002/013701, filed Dec. 26, 2002,
ΣΔ MODULATOR FOR PLL CIRCUIT

CROSS-REFERENCE TO RELATED APPLICATIONS

This application is based upon prior International Patent Application No. PCT/JP2002/013701, filed Dec. 26, 2002, the entire contents of which are incorporated herein by reference.

BACKGROUND OF THE INVENTION

The present invention relates to a PLL circuit utilizing a ΣΔ modulator.

In recent years, there has arisen a demand for PLL circuits employed in mobile communication equipment such as cellular phones to improve their channel switching speed and C/N characteristics to cope with the trends of increased integer ratio N and reduced power consumption in such equipment. In order to satisfy such demand, PLL circuits utilizing a ΣΔ modulator have been put in practical use. These PLL circuits utilizing a ΣΔ modulator are now required to improve their channel switching speed and C/N characteristics still further.

The channel switching time and C/N characteristics are important loop characteristics of a PLL circuit. Specifically, it is required to shorten the time required for switching from a certain lock-up frequency to another lock-up frequency and to reduce the phase noise contained in an output signal frequency.

In order to meet these requirements, fractional-N PLL frequency synthesizers (PLL circuits) using a fractional frequency division ratio of a comparison frequency divider configuring a PLL loop have recently been put in practical use. It is known that this type of fractional-N PLL circuits, which allows a reference signal frequency to be set high, is advantageous to improve the channel switching time and the C/N characteristics.

However, the fractional value of a fractional frequency division ratio is obtained equivalently and on an average by temporally varying the integer division value. Specifically, a fixed frequency division value N is periodically divided by N+1 to equivalently obtain a fractional frequency division ratio. For the case of 1/8 division, for example, eight dividing operations are implemented by repeating seven divisions by N and one division by N+1, while for the case of 3/8 division, eight dividing operations are implemented by repeating five divisions by N and three divisions by N+1.

However, when a comparison signal divided by such fractional-N operation is compared with a reference signal by means of a phase comparator, periodical phase errors occur due to periodical repetitions of N divisions and (N+1) divisions, which in turn causes spurious noise to occur in output signals of a voltage controlled oscillator.

Therefore, as one means for preventing occurrence of spurious noise associated with the fractional-N operation, a ΣΔ fractional-N PLL frequency synthesizer 100 having a multi-stage noise shaping (MASH) ΣΔ modulator as shown in FIG. 10 has been proposed. The ΣΔ modulator serves as means for preventing occurrence of spurious noise by randomly varying a frequency division value used for performing a fractional-N operation.

In FIG. 10, an oscillator 1 outputs to a reference frequency divider 2 a reference clock signal having a natural frequency based on oscillation of a crystal resonator. The reference frequency divider 2 is configured by a counter circuit, divides a reference clock signal based on a predetermined frequency division ratio and outputs a reference signal fr thus produced to a phase comparator 3.

The phase comparator 3 is provided with a comparison signal fp from a comparison frequency divider 4. The phase comparator 3 outputs a pulse signal according to a phase difference between the reference signal fr and the comparison signal fp to a charge pump 5.

The charge pump 5 outputs an output signal to a lowpass filter (LPF) 6 based on the pulse signal output from the phase comparator 3.

This output signal has a pulse component contained in its DC component, and the DC component varies in accordance with frequency variations of the pulse signal, while the pulse component varies based on the phase difference of the pulse signal.

The LPF 6 smooths the output signal of the charge pump 5 to remove any high frequency component therefrom and outputs an output signal thus obtained to a voltage controlled oscillator (VCO) 7 as a controlled voltage.

The VCO 7 outputs an output signal fvco with a frequency according to the controlled voltage to an external circuit as well as to the comparison frequency divider 4.

The frequency division ratio of the comparison frequency divider 4 is set to be varied arbitrarily by a ΣΔ modulator 8.

The ΣΔ modulator 8 is configured as a third-order modulator including n-bit integrators (Σ) 9a to 9c, differentiators (Δ) 10a to 10f configured by flip-flop circuits, and an adder 11. The integrators 9a to 9c and the differentiators 10a to 10f operate using the comparison signal fp from the comparison frequency divider 4 as a clock signal.

The integrator 9a is provided with a numerator value F for the ΣΔ modulator 8 from an external device (not shown). The integrator 9a accumulates the input value F based on the clock signal and outputs an overflow signal OF1 when the accumulated value becomes greater than a denominator value (modulo value) Q. After the overflow, the integrator 9a subtracts the denominator value Q from the accumulated value and continues to accumulate the input value F.

The denominator value (modulo value) Q is set to $2^n$, and the numerator value F is input as an (n−1)-bit digital signal when the power of the denominator value Q is n. The denominator values Q of the integrators 9a to 9c are an identical value, 1024 for example, and the numerator value F is 30.

The overflow signal OF1 from the integrator 9a is provided to the adder 11 via the differentiators 10a and 10b as an input signal a. The accumulated value X1 of the integrator 9a is provided to the integrator 9b.

The integrator 9b performs an accumulating operation on an input signal of the accumulated value X1 and outputs an accumulated value X2 to the integrator 9c. An overflow signal OF2 output from the integrator 9b is provided to the adder 11 via the differentiator 10c as an input signal b, and also provided to the adder 11 via the differentiators 10c and 10d as an input signal c.

The integrator 9c performs an accumulating operation on an input signal of the accumulated value X2 and output an overflow signal OF3. The overflow signal OF3 is provided to the adder 11 as an input signal d, provided to the adder 11 via the differentiator 10e as an input signal 4, and also provided to the adder 11 via the differentiators 10e and 10f as an input signal f.

The differentiators 10a, 10b, and 10c are inserted for correcting any deviation in timing of the input signals a to f caused by operation of the differentiators 10d, 10e, and 10f according to the clock signal.

The adder 11 implements the following computation:

(+1)a+(+1)b+(−1)c+(+1)d+(−2)e+(+1)f based on the input signals a to f. A coefficient to be multiplied by each of the input signals a to f is set based on a Pascal triangle.

FIG. 12 shows the computation results (excluding +N) of the computation operation of the adder 11 as described above. As shown in FIG. 12, the adder 11 produces random numbers which vary arbitrarily in the range from +4 to −3.

The adder 11 is provided with a fixed frequency division ratio N which has been preset. The adder 11 adds the above-mentioned computation result to the fixed frequency division ratio N and outputs the result to the comparison frequency divider 4.

Due to the operation of the adder 11 as described above, the frequency division ratio provided to the comparison frequency divider 4 varies randomly with respect to the fixed frequency division ratio N, for example as N, N+1, N, N−2, N+3, N−1, and N−1.

The comparison frequency divider 4 thus performs a fractional-N operation on an average based on the frequency division ratios received from the adder 11.

FIG. 11 shows a circuit equivalent to the ΣΔ fractional-N PLL frequency synthesizer shown in FIG. 10.

In this equivalent circuit, the configuration of a ΣΔ modulator 12 is slightly different from that of the ΣΔ modulator 8, while other configurations of the equivalent circuit are the same as in FIG. 10. In the ΣΔ modulator 12, integrators (Σ) 13a to 13c have similar configurations to the integrators 9a to 9c and perform a similar accumulating operation based on a numerator value F input thereto.

Differentiators 14a to 14e are each configured by a flip-flop circuit and operate using a comparison signal fp output from the comparison frequency divider 4 as a clock signal.

An overflow signal OF1 from the integrator 13a is provided to an adder 15a via differentiators 14a and 14b as an input signal a. An overflow signal OF2 from the integrator 13b is provided to an adder 15b via a differentiator 14c as an input signal d.

An overflow signal OF3 from the integrator 13c is provided to the adder 15b as an input signal e and also provided to the adder 15b via a differentiator 14d as an input signal f.

The adder 15b performs the computation b=d+e−f by adding the input signals e and d and subtracting the input signal f to obtain an output signal b and outputs the output signal b to the adder 15a.

The output signal b of the adder 15b is also provided to the adder 15a via a differentiator 14e as an input signal c.

The adder 15a performs the computation a+b−c by adding the input signals a and b and then subtracting the input signal c and provides the result thus obtained to the adder 15c.

The adder 15c adds the output signal from the adder 15a to the fixed frequency division ratio N provided by an external device and provides the resultant value to the comparison frequency divider 4.

Accordingly, the adders 15a and 15b of this ΣΔ modulator 12 perform the following computation operation:

(+1)a+(+1)b+(−1)c+(+1)d+(−2)e+(+1)f.

As the result of such operation, random numbers varying arbitrarily in the range from +4 to −3 are output from the adder 15a.

The adder 15c is provided with a fixed frequency division ratio N that has been preset. The adder 15c adds the aforementioned computation result to the fixed frequency division ratio N and outputs the result thus obtained to the comparison frequency divider 4.

As the result of such operation, the frequency division ratio input to the comparison frequency divider 4 varies with respect to the fixed frequency division ratio N randomly, for example as N, N+1, N, N−2, N+3, N−1, and N−1.

The comparison frequency divider 4 thus performs a fractional-N operation on an average based on the frequency division ratios output from the adder 15c.

FIG. 12 shows an example of random numbers indicating the modulation width of modulated outputs from the third-order ΣΔ modulator 8 or the ΣΔ modulator 12 as shown in FIG. 10 and FIG. 11, respectively. FIG. 13 shows an example of random numbers produced by a fourth-order ΣΔ modulator. As seen from these two figures, as the order of ΣΔ modulators becomes greater, the width of variation of the output signals from the ΣΔ modulators becomes greater and the modulation width of the frequency division ratio at the comparison frequency divider 4 is increased.

FIGS. 14A to FIG. 14C show examples of random numbers produced by second-order to fourth-order ΣΔ modulators, respectively.

FIG. 15B shows a frequency spectrum of an output signal from a fractional-N PLL frequency synthesizer 100 employing a third-order ΣΔ modulator as described above, while FIG. 15A shows a frequency spectrum of an output signal from a fractional-N PLL frequency synthesizer employing a fourth-order ΣΔ modulator.

As seen from the comparison between FIGS. 15A and 15B, as the order of ΣΔ modulators becomes greater, the noise level that occurs when a PLL loop is locked is increased and a problem is posed that C/N characteristics are degraded.

In contrast, if the order decreases, the C/N characteristics are improved. However, ΣΔ modulation becomes instable, whereby the output signal is adversely affected.

SUMMARY OF THE INVENTION

The present invention provides a ΣΔ modulator that is capable of decreasing the modulation width at a comparison frequency divider without decreasing the order of the modulator.

A first aspect of the present invention provides a ΣΔ modulator for producing a modulation signal for modulating a frequency division ratio of a comparison frequency divider of a PLL circuit. The ΣΔ modulator includes an adder for producing random numbers for modulating a frequency division ratio of a comparison frequency divider as a modulation signal. The adder produces the random number to decrease the modulation width of the frequency division ratio.

A second aspect of the present invention provides a ΣΔ modulator for producing a modulation signal for modulating a frequency division ratio of a comparison frequency divider of a PLL circuit. The ΣΔ modulator includes an adder for producing random numbers for modulating a frequency division ratio of a comparison frequency divider as a modulation signal by addition processing of input signals according to a predetermined operational logic. The predetermined operational logic is set to decrease the modulation width of the frequency division ratio.

A third aspect of the present invention provides a ΣΔ modulator for producing a modulation signal for modulating a frequency division ratio of a comparison frequency divider of a PLL circuit. The ΣΔ modulator includes a plurality of integrators connected in series, each of which integrates an input signal and outputs an overflow signal when its integrated value has exceeded a predetermined value. A plurality of differentiators are connected selectively to the plurality of integrators, and each of the differentiators transfers the overflow signal of its associated integrator. An adder multiplies a predetermined coefficient by the overflow signals transferred from the plurality of differentiators and adds the multiplied values to produce the modulation signal. The predetermined coefficient is set such that the modulation width of the frequency division ratio decreases.

A fourth aspect of the present invention provides a $\Sigma\Delta$ modulator for producing a modulation signal for modulating a frequency division ratio of a comparison frequency divider of a PLL circuit. The $\Sigma\Delta$ modulator includes a plurality of integrators connected in series, each of which integrates an input signal and outputs an overflow signal when its integrated value has exceeded a predetermined value. A plurality of differentiators are connected selectively to the plurality of integrators, and each of the differentiators transfers the overflow signal of its associated integrator. Each of a plurality of adders multiplies a predetermined coefficient by the overflow signal transferred from its associated differentiator and adds the multiplied values. The predetermined coefficient is set such that the modulation width of the frequency division ratio decreases.

A fifth aspect of the present invention provides a $\Sigma\Delta$ modulator for producing a modulation signal for modulating a frequency division ratio of a comparison frequency divider of a PLL circuit. The $\Sigma\Delta$ modulator includes N (N≧4) integrators connected in series, each of which integrates an input signal and outputs an overflow signal when its integrated value has exceeded a predetermined value, N adders connected in series for producing a computation signal, and a plurality of differentiator each of which transfers the overflow signal of its associated integrator or the computation signal of its associated adder. The first stage adder adds an overflow signal from an Nth stage integrator, an overflow signal transferred from the differentiator associated with the Nth stage integrator, and an overflow signal transferred from the differentiator associated with an (N−1)th stage integrator. Each of second to (N−2)th stage adders adds a computation signal of the previous stage adder, a computation signal transferred from the previous stage adder via a differentiator, and an overflow signal transferred from the differentiators associated with the (N−2)th stage to second stage integrators. The (N−1)th stage adder adds a computation signal of the previous stage adder and an overflow signal transferred from a differentiator associated with a first stage integrator, and subtracts a computation signal transferred from the previous stage adder via a differentiator. The Nth stage adder adds a computation signal of the (N−1) stage adder and a fixed frequency division ratio to produce the modulation signal.

A sixth aspect of the present invention provides a $\Sigma\Delta$ modulator for producing a modulation signal for modulating a frequency division ratio of a comparison frequency divider of a PLL circuit. The $\Sigma\Delta$ modulator includes three integrators connected in series, each of which integrates an input signal and outputs an overflow signal when its integrated value has exceeded a predetermined value, three adders connected in series for producing a computation signal; and a plurality of differentiators connected to the three integrators and two adders, each of which transfers an overflow signal of its associated integrator or a computation signal of its associated adder. The first adder adds an overflow signal from the first integrator, an overflow signal transferred from the differentiator associated with the first integrator, and an overflow signal transferred from the differentiator associated with the second integrator. The second adder adds a computation signal of the first adder and an overflow signal transferred from the differentiator associated with the third integrator, and subtracts a computation signal transferred from the first adder via the differentiator. The third adder adds the computation signal of the second adder and a fixed frequency division ratio to produce the modulation signal.

A seventh aspect of the present invention provides a $\Sigma\Delta$ modulator for producing a modulation signal for modulating a frequency division ratio of a comparison frequency divider of a PLL circuit. The $\Sigma\Delta$ modulator includes four integrators connected in series, each of which integrates an input signal and outputs an overflow signal when its integrated value has exceeded a predetermined value, four adders connected in series for producing a computation signal, and a plurality of differentiators each of which transfers the overflow signal of its associated integrator or the computation signal of its associated adder. The first adder adds an overflow signal from the first integrator, an overflow signal transferred from the differentiator associated with the first integrator, and an overflow signal transferred from the differentiator associated with the second integrator. The second adder adds a computation signal of the first adder, a computation signal transferred from the first adder via the differentiator, and an overflow signal transferred from the differentiator associated with the third integrator. The third adder adds the computation signal of the second adder and an overflow signal transferred from the differentiator associated with the fourth integrator, and subtracting a computation signal transferred from the second adder via the differentiator. The fourth adder adds the computation signal of the third adder and a fixed frequency division ratio to produce the modulation signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5A shows the number sequence in a common Pascal's triangle;

FIG. 5B shows the number sequence in a Pascal's triangle for finding a coefficient used in a conventional $\Sigma\Delta$ modulator;

FIG. 5C shows the number sequence in a Pascal's triangle for finding a coefficient used in the $\Sigma\Delta$ modulator according to the present invention;

FIG. 6 shows a Pascal's triangle for finding a coefficient used in the ΣΔ modulator according to the present invention;

DETAILED DESCRIPTION OF THE PREFERRED EMBODIMENTS

Figure 1:
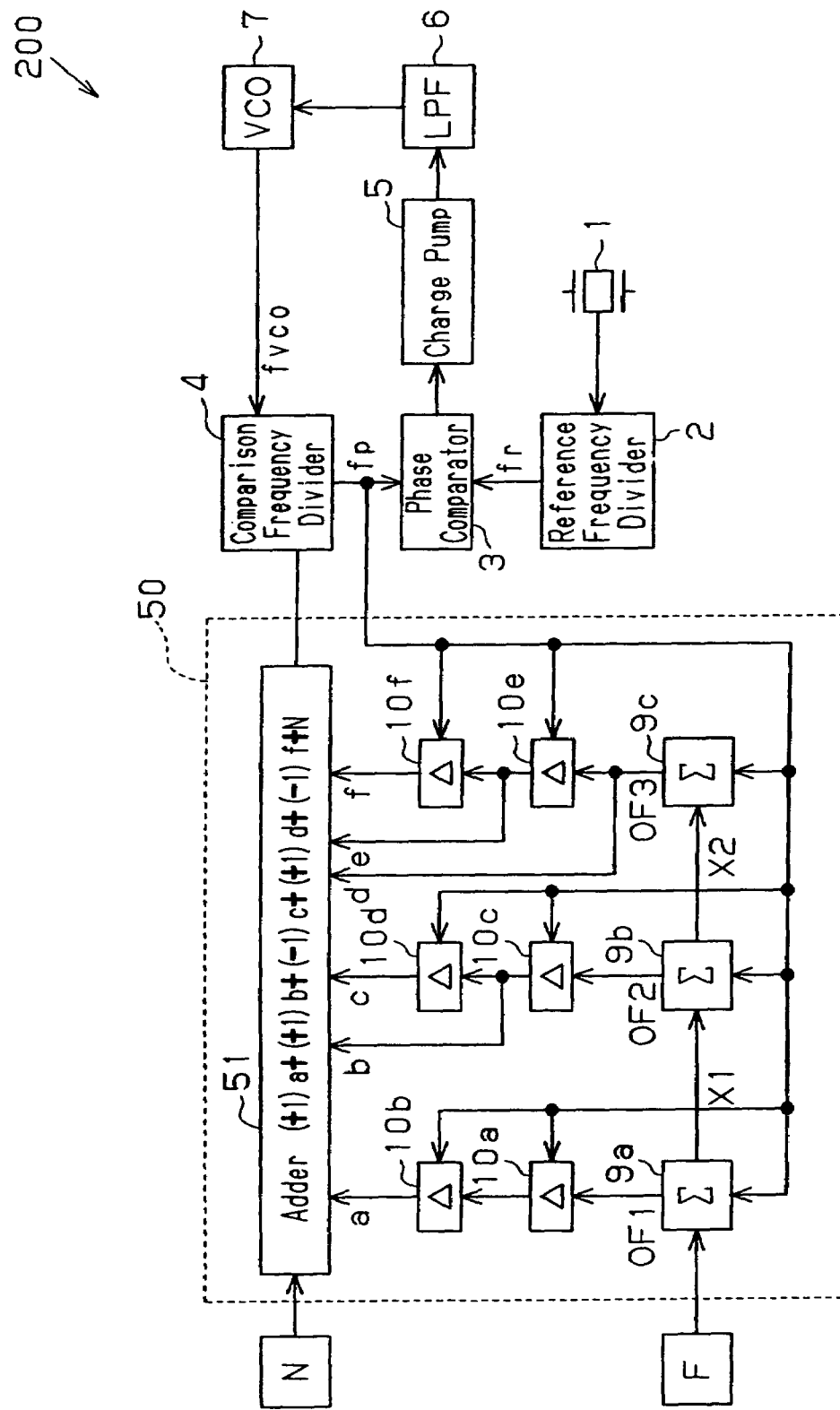
FIG. 1 is a schematic block diagram of a PLL frequency synthesizer having a third-order $\Sigma\Delta$ modulator according to a first embodiment of the present invention.

FIG. 1 shows a ΣΔ fractional-N PLL frequency synthesizer 200 according to a first embodiment of the present invention. The first embodiment is a partial modification of the conventional ΣΔ modulator 8 shown in FIG. 10, and description will be made with identical component parts being designated by identical reference characters.

The frequency synthesizer 200 includes an oscillator 1, a reference frequency divider 2, a phase comparator 3, a comparison frequency divider 4, a charge pump 5, an LPF (lowpass filter) 6, a voltage controlled oscillator (VCO) 7, and a third-order ΣΔ modulator 50.

The third-order ΣΔ modulator 50 includes three integrators 9a to 9c, six differentiators 10a to 10f, and an adder 51. The integrators 9a to 9c and the differentiator 10a to 10f operate similarly to those in the prior-art example shown in FIG. 10, and the adder 51 is provided with input signals a to f.

The adder 51 performs the computation:

$$(+1)a+(+1)b+(-1)c+(+1)d+(-1)f$$

based on the input signals a to f. The coefficients multiplied by the input signals a to f are set respectively based on the modified Pascal triangle as shown in FIG. 5C.

The adder 51 is designed by a well-known automatic logic synthesizer which performs logic synthesis automatically based on the input of the computation equation as described above.

The adder 51 adds a fixed frequency division ratio N input by an external device (not shown) to the aforementioned computation result and outputs the result thus obtained to the comparison frequency divider 4. Specifically, the adder 51 outputs random numbers varying in the range from N+2 to N−2.

This means that the coefficients multiplied by the input signals a to f may be made smaller in order to decrease the modulation width in the adding operation of the prior-art example. In the first embodiment, therefore, the coefficient (−2) for the input signal e is not used. More specifically, according to the present invention, relatively small coefficients (+1 and −1) are used. In other words, according to the present invention, the absolute value of each of the coefficients is set to less than 2.

Figure 2:
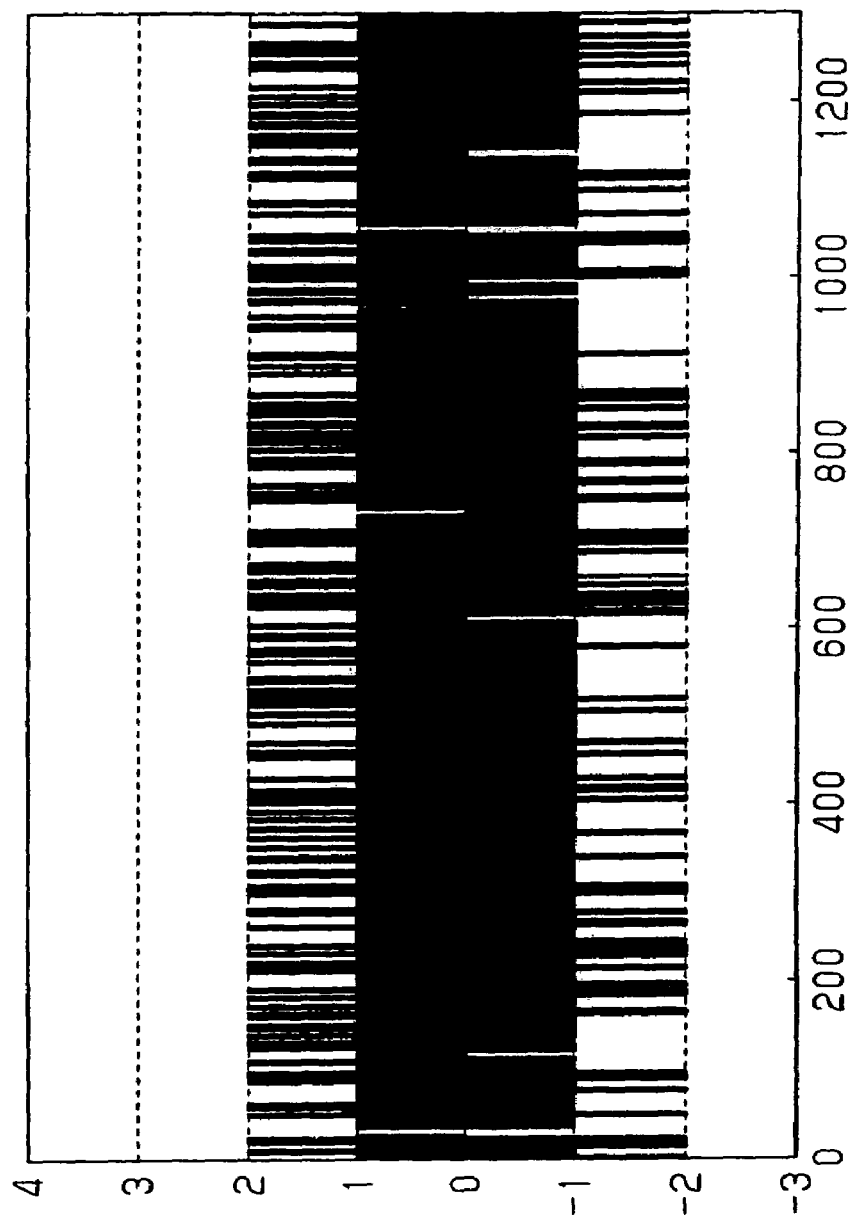
FIG. 2 is an illustration showing an example of modulation width of modulated outputs from the third-order $\Sigma\Delta$ modulator in FIG. 1.

An example of random numbers output from the adder 51 of the ΣΔ modulator 50 thus constructed is shown in FIG. 2. As seen from FIG. 2, the random numbers output from the adder 51 vary in the range from N−2 to N+2 and the width of variation is smaller than that of the conventional third-order ΣΔ modulator 8 shown in FIG. 10.

Figure 12:
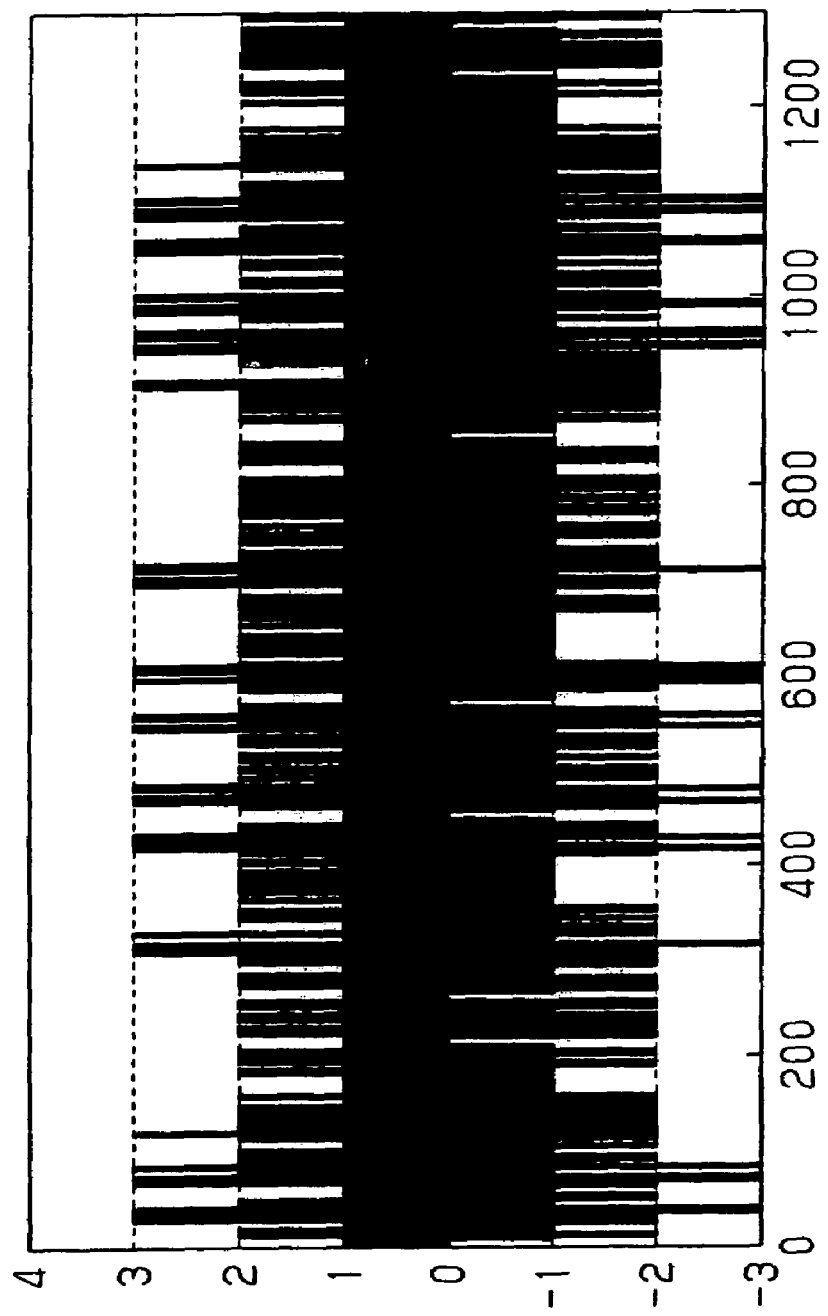
FIG. 12 is an illustration showing an example of modulation width of modulated outputs of a conventional third-order ΣΔ modulator.

As the result of such operation of the adder 51, the frequency division ratio input to the comparison frequency divider 4 varies randomly with respect to the fixed frequency division ratio N, but the width of variation thereof is smaller than that of the prior-art example as shown in FIG. 12.

The comparison frequency divider 4 thus performs an averaging, fractional-N operation based on the frequency division ratios output from the adder 51, which vary randomly.

Figure 3:
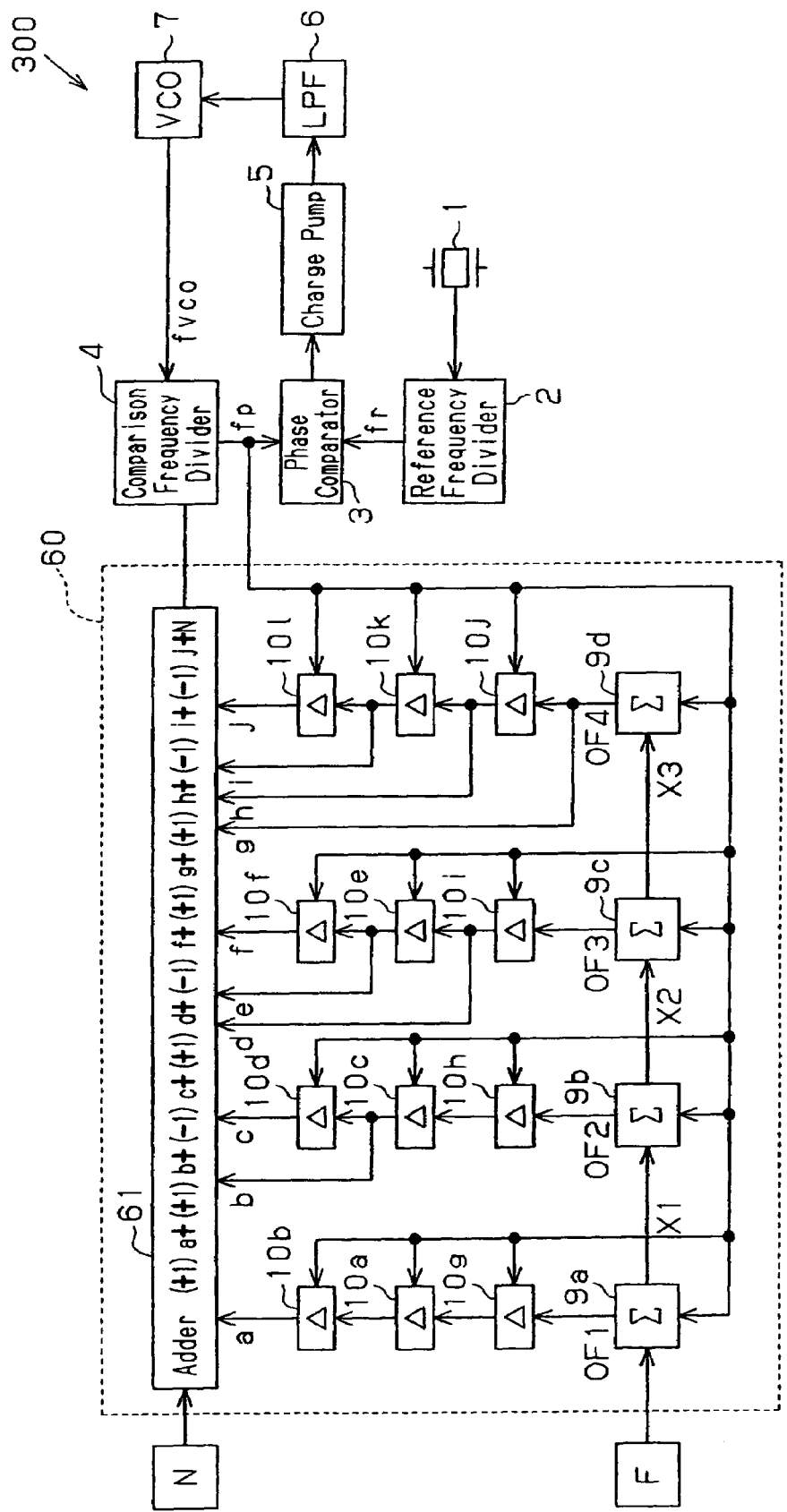
FIG. 3 is a schematic block diagram showing a PLL frequency synthesizer having a fourth-order $\Sigma\Delta$ modulator according a second embodiment of the present invention.

FIG. 3 shows a ΣΔ fractional-N PLL frequency synthesizer 300 according to a second embodiment of the present invention. The frequency synthesizer 300 includes a ΣΔ modulator 60. The ΣΔ modulator 60 is a fourth-order ΣΔ modulator, which is configured by adding one more integrator 9d and six more differentiators 10g to 10l to the third-order ΣΔ modulator 50 in FIG. 1 and modifying the operational logic of the adder 61.

Specifically, an overflow signal OF1 output from the integrator 9a is input to the differentiator 10a via the differentiator 10g, while an overflow signal OF2 output from the integrator 9b is input to the differentiator 10c via the differentiator 10h. An overflow signal OF3 output from the integrator 9c is input to the differentiator 10e via the differentiator 10i.

An accumulated value X3 of the integrator 9c is provided to the integrator 9d. An overflow signal OF4 from the integrator 9d is input to the adder 61 as an input signal g, and is also input to the differentiator 10j. An output signal from the differentiator 10j is input to the adder 61 as an input signal h and is also input to the differentiator 10k. An output signal from the differentiator 10k is input to the adder 61 as an input signal i and is also input to the differentiator 10l. An output signal from the differentiator 10l is input to the adder 61 as an input signal j.

The adder 61 performs the computation:

$$(+1)a+(+1)b+(-1)c+(+1)d+(-1)f+(+1)g+(+1)h+(-1)i+(-1)j$$

based on the input signals a to j. The coefficients multiplied by the input signals a to j are set based on a modified Pascal's triangle. As the result of such operation, random numbers varying arbitrarily in the range from N+4 to N−3 are output from the adder 61.

Incidentally, the adder of the prior-art example corresponding to this fourth-order ΣΔ modulator performs the following computation:

(+1)a+(+1)b+(−1)c+(+1)d+(−2)e+(+1)f+(+1)g+(−3)h+(+3)i+(−1)j.

This means that, in order to decrease the modulation width exhibited by the adding operation according to the prior-art example, the coefficients multiplied by the input signals a to j may be made smaller. According to the second embodiment, therefore, the coefficient (−2) for the input signal e, the coefficient (−3) for the input signal h, and the coefficient (+3) for the input signal i are not used, and instead the coefficient (−1) is used for the input signal f, the coefficient (+1) for the input signal h and the coefficient (−1) for the input signal i. That is, in the present invention, the absolute value of each of the coefficients is set to less than 2.

Figure 4:
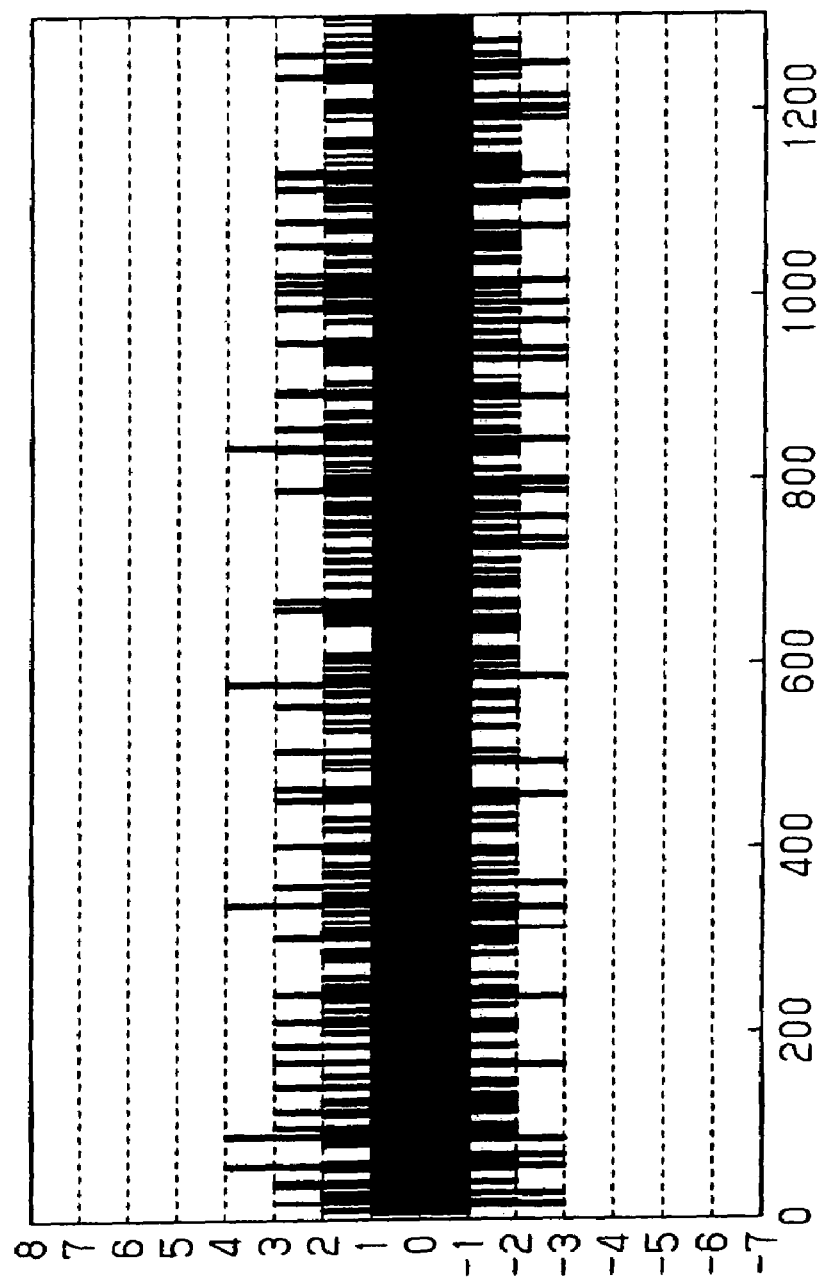
FIG. 4 is an illustration showing an example of modulation width of modulated outputs from the fourth-order $\Sigma\Delta$ modulator in FIG. 3.
Figure 13:
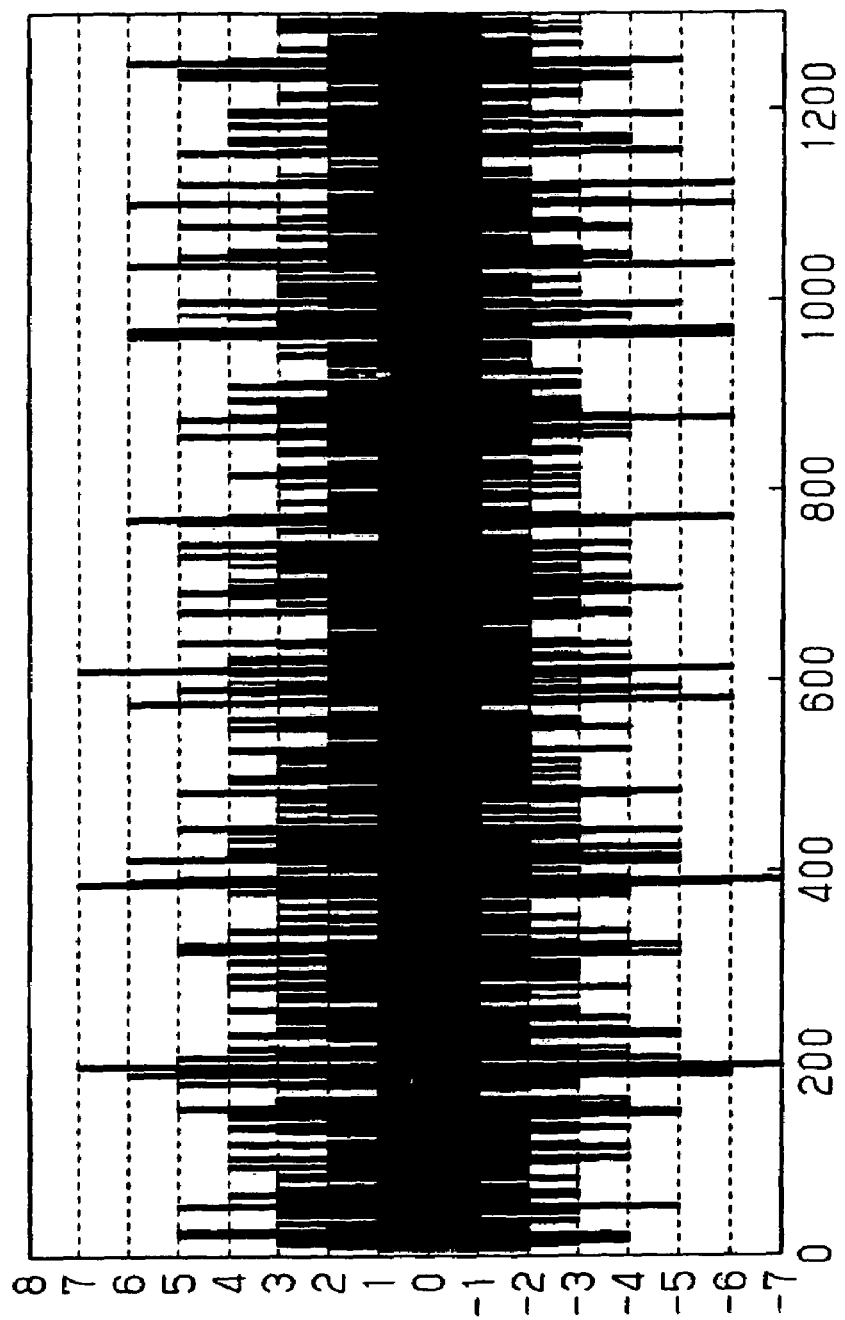
FIG. 13 is an illustration showing modulation width of modulated outputs of a conventional fourth-order ΣΔ modulator.
Figure 14A:
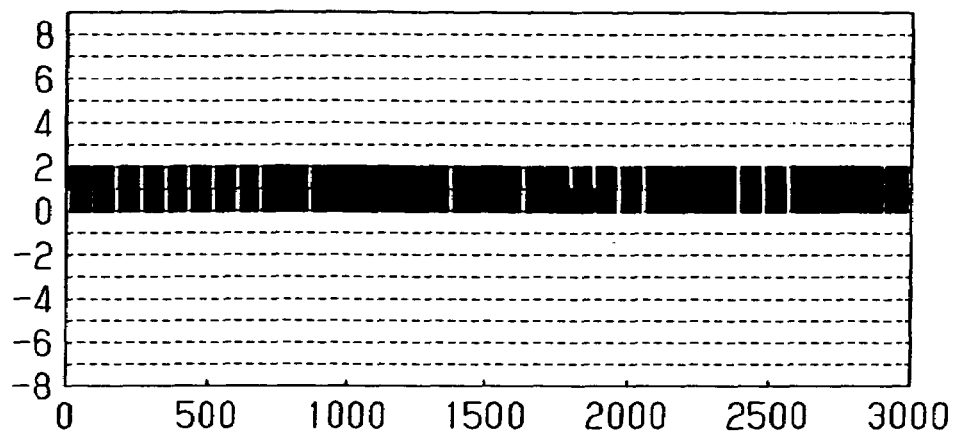
FIG. 14A is an illustration showing an example of modulation width of modulated outputs of a conventional second-order ΣΔ modulator.
Figure 14B:
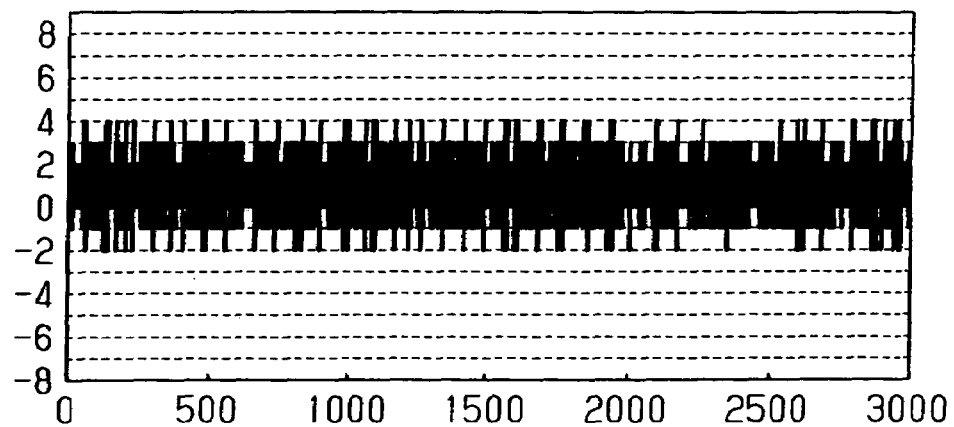
FIG. 14B is an illustration showing an example of modulation width of modulated outputs of a conventional third-order ΣΔ modulator.
Figure 14C:
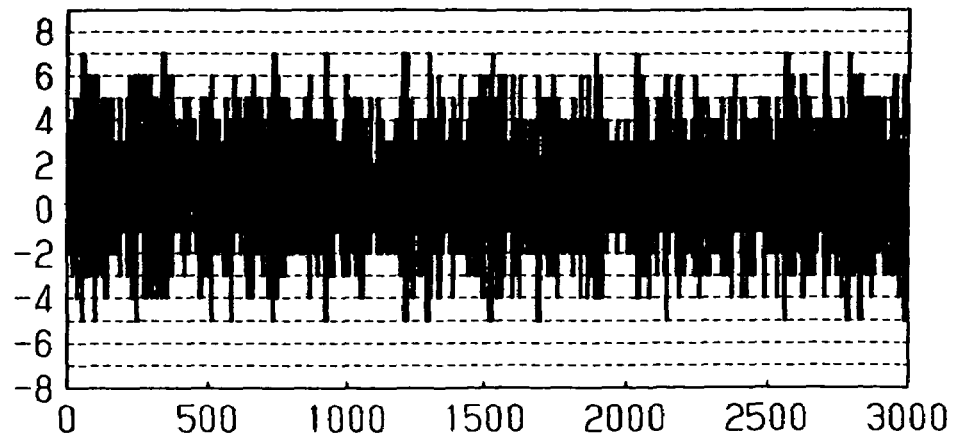
FIG. 14C is an illustration showing an example of modulation width of modulated outputs of a conventional fourth-order ΣΔ modulator.
Figure 15A:
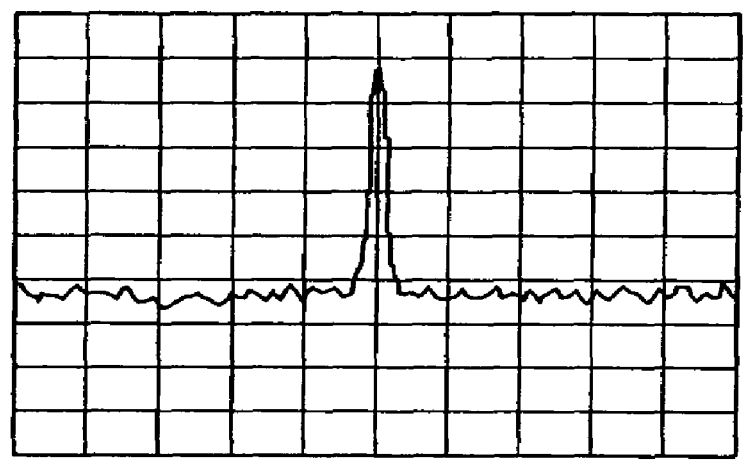
FIG. 15A is an illustration showing a frequency spectrum of an output signal of a PLL frequency synthesizer having a third-order ΣΔ modulator.
Figure 15B:
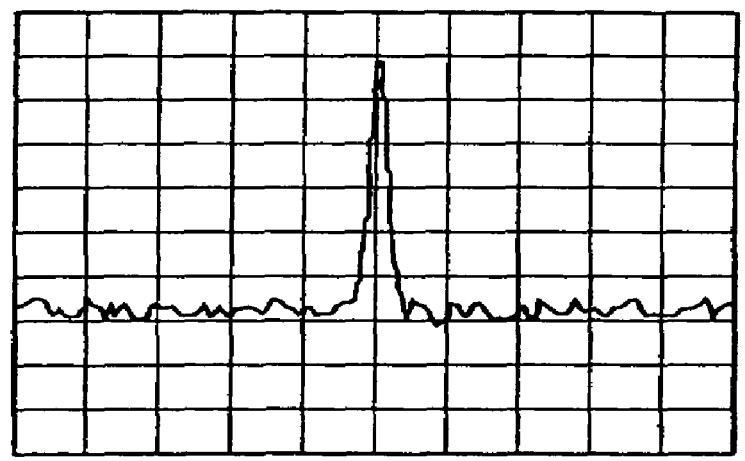
FIG. 15B is an illustration showing a frequency spectrum of an output signal from a PLL frequency synthesizer having a fourth-order ΣΔ modulator.

FIG. 4 shows random numbers which are the computation values output from the ΣΔ modulator 60 in FIG. 3. The random numbers in FIG. 4 exhibit a smaller variation width in comparison with the random numbers output from the conventional fourth-order ΣΔ modulator as shown in FIG. 13.

Hereinafter, Pascal's triangles for finding coefficients to be set for the adders 51 and 61 will be described.

A common Pascal's triangle is obtained as the number sequence shown in FIG. 5A. The start conditions are set for the first row, and values $g(x)$ in the second row onwards are calculated regularly based on the following formula from the value $f(x)$ in the previous row.

$$g(x) = A \cdot f(x-1) + B \cdot f(x) + C \cdot f(x+1)$$

The number sequence in FIG. 5A is obtained by setting A=C=1 and B=0, and setting n=1, and (n−6) to (n+6)=0 in FIG. 6, as the start conditions. FIG. 6 shows the Pascal's triangle according to the present invention.

Figure 10:
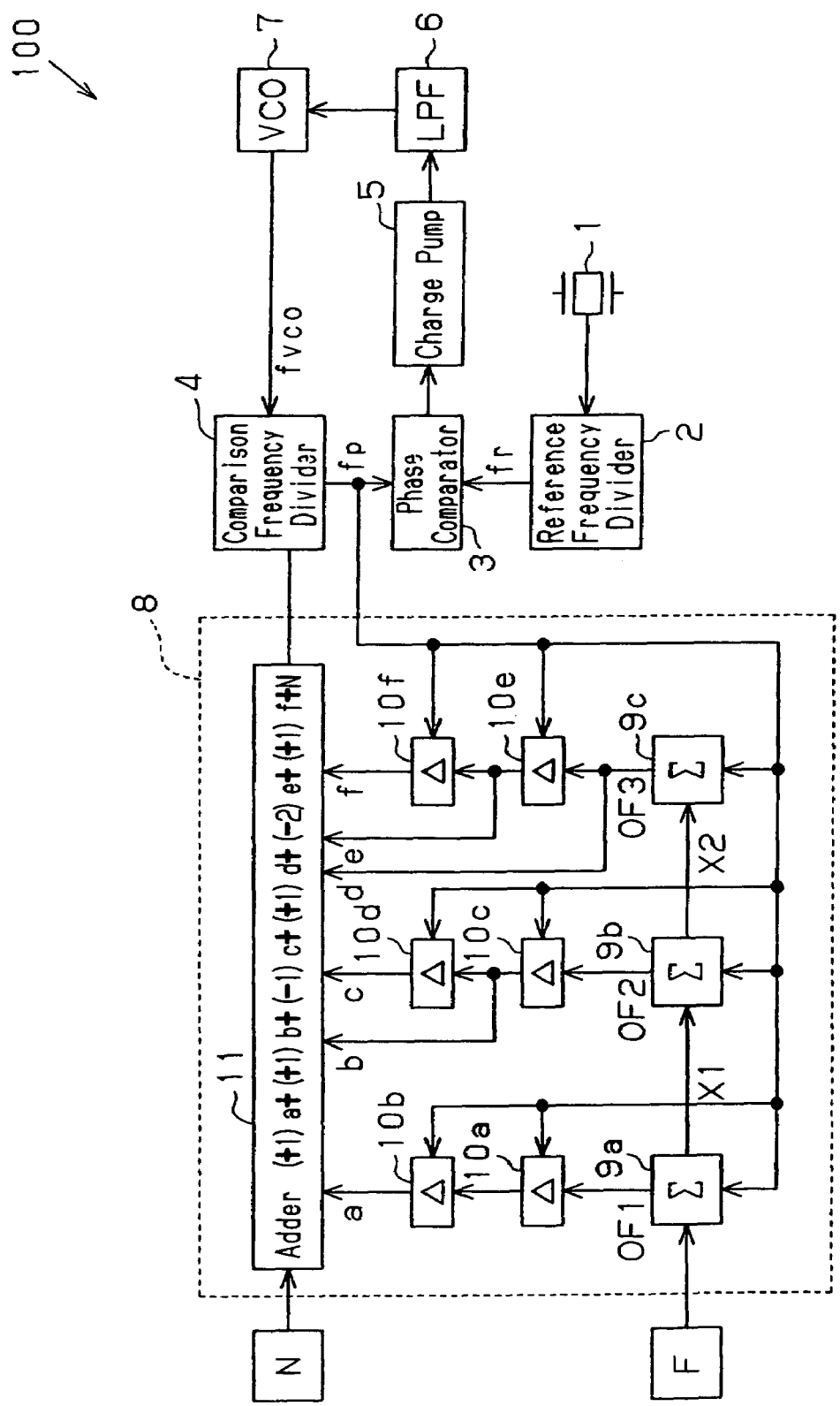
FIG. 10 is a schematic block diagram showing a PLL frequency synthesizer having a conventional ΣΔ modulator.

The number sequence in FIG. 5B represents a Pascal's triangle for finding coefficients for the conventional adder 11 shown in FIG. 10. This number sequence is obtained by setting A=−1, B=0, and C=1, and n=1, and (n−6) to (n+6)=0, as the start conditions.

This number sequence (1, 1, −1, 1, −2, 1) is used as coefficients for the input signals a to f in a third-order adder, while the number sequence (1, 1, −1, 1, −2, 1, 1, −3, 3, −1) is used as coefficients for the input signals a to j in a fourth-order adder.

The number sequence shown in FIG. 5C represents a Pascal's triangle for finding coefficients for the adder 51 of the first embodiment in FIG. 1 and the adder 61 of the second embodiment in FIG. 3. This number sequence is obtained by setting A=C=1, B=0, n=1, n+2=−2, n+4=2, n+6=−2, and others to zero, as the start conditions.

The number sequence (1, 1, −1, 1, 0, −1) is used as coefficients for the input signals a to f in the third-order adder 51, while the number sequence (1, 1, −1, 1, 0, −1, 1, 1, −1, −1) is used as coefficients for the input signals a to j in the fourth-order adder 61.

Figure 7:
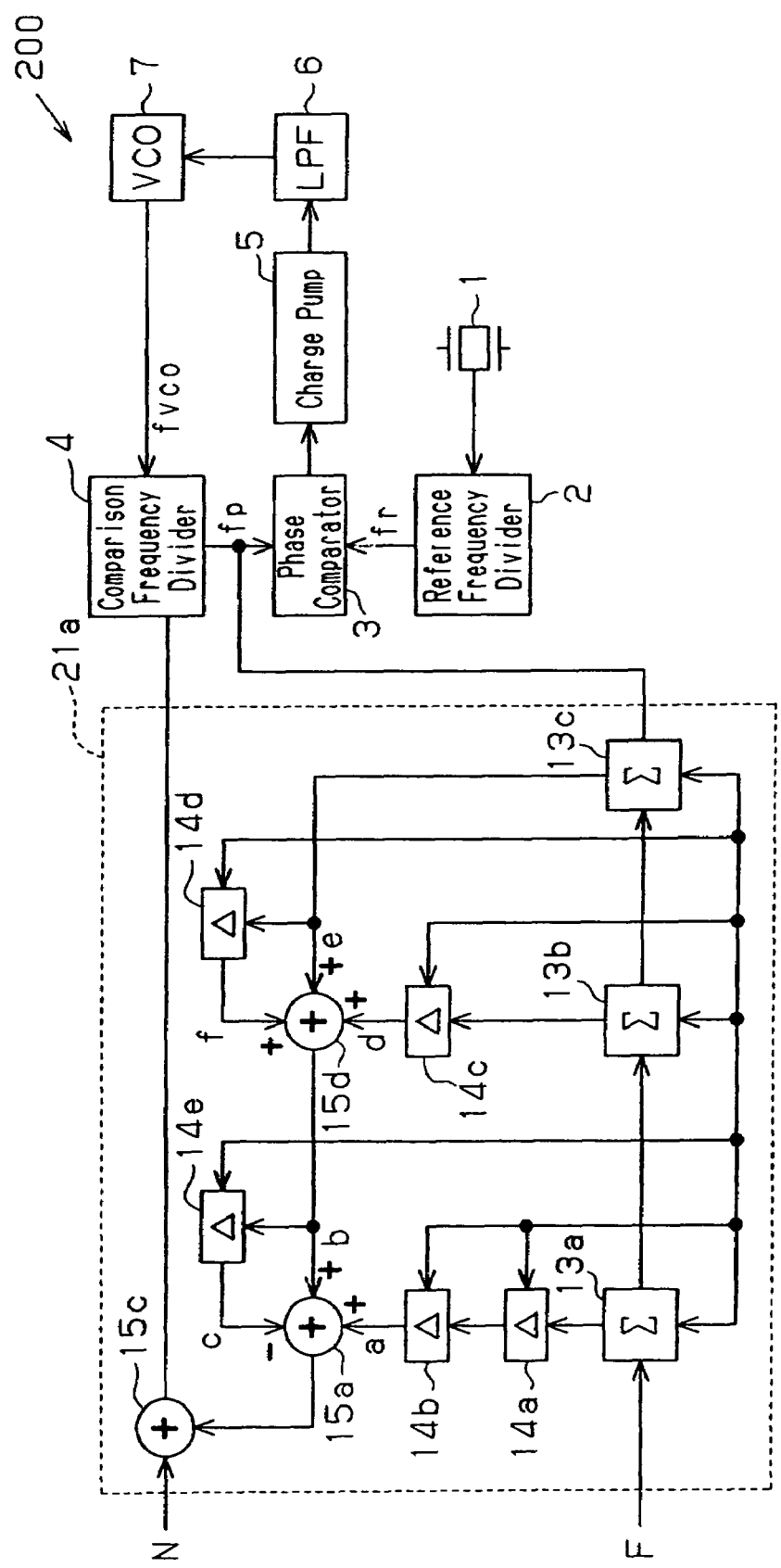
FIG. 7 is a schematic block diagram showing a PLL frequency synthesizer having an equivalent circuit for the ΣΔ modulator in FIG. 1.
Figure 11:
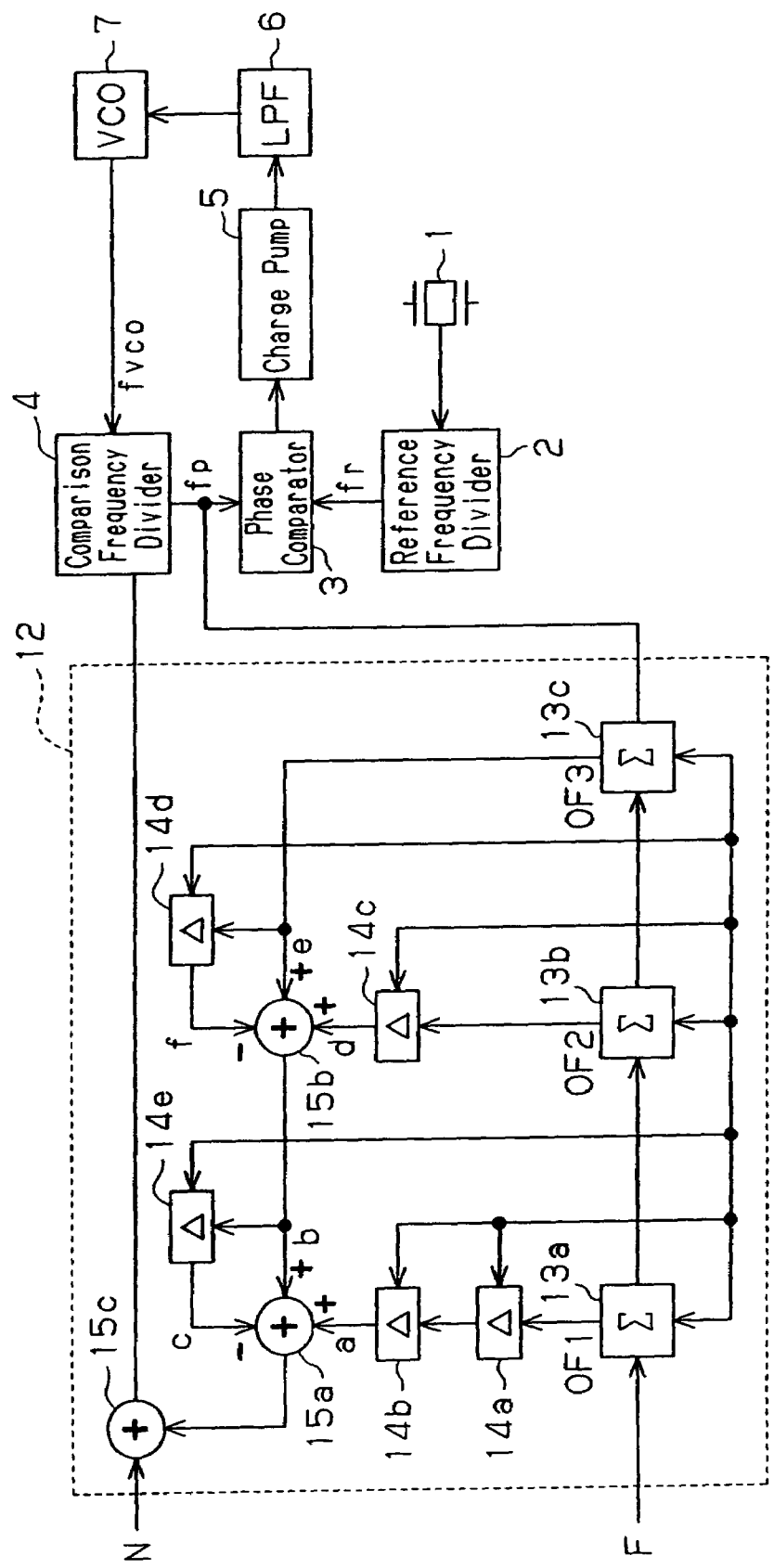
FIG. 11 is a schematic block diagram showing a PLL frequency synthesizer having an equivalent circuit for the ΣΔ modulator in FIG. 10.

FIG. 7 shows a ΣΔ fractional-N PLL frequency synthesizer 200 according to the first embodiment of the present invention having a ΣΔ modulator 21a equivalent to the ΣΔ modulator 50 in FIG. 1. The ΣΔ modulator 21a is a partial modification of the conventional ΣΔ modulator 12 shown in FIG. 11. Description will be made with component parts identical to those in FIG. 11 being designated by identical reference characters. The frequency synthesizer 200 includes an oscillator 1, a reference frequency divider 2, a phase comparator 3, a comparison frequency divider 4, a charge pump 5, an LPF (lowpass filter) 6, a voltage controlled oscillator (VCO) 7, and a third-order ΣΔ modulator 21a.

The ΣΔ modulator 21a includes three integrators 13a to 13c, five differentiators 14a to 14e, and three adders 15a, 15c, and 15d.

The adder 15d performs the computation (b=d+e+f) by adding input signals e, d, and f, and outputs an input signal b indicating the result thus obtained to the adder 15a. The adder 15a performs the computation (a+b−c) by adding input signals a and b and then subtracting an input signal c, and outputs an output signal indicating the result thus obtained to the adder 15c. The adder 15c adds the output signal from the adder 15a to a predetermined fixed frequency division ratio N provided by an external device (not shown) and outputs the value thus obtained to the comparison frequency divider 4.

Accordingly, the adders 15a, 15c, and 15d perform the adding operation:

(+1)a+(+1)b+(−1)c+(+1)d+(−1)f.

Figure 8:
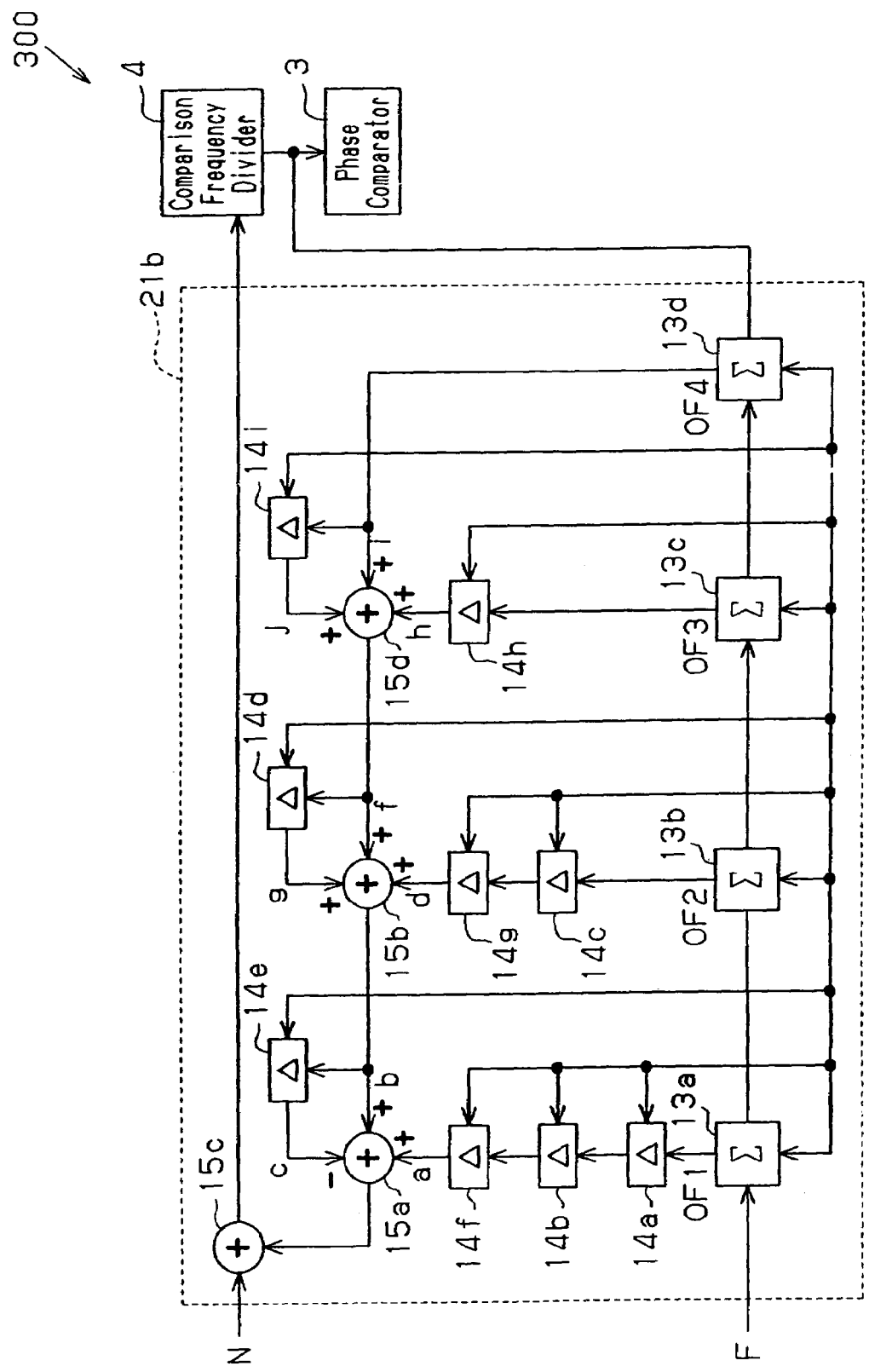
FIG. 8 is a schematic block diagram showing a PLL frequency synthesizer having an equivalent circuit for the ΣΔ modulator in FIG. 3.

FIG. 8 shows a ΣΔ fractional-N PLL frequency synthesizer 300 according to the second embodiment of the present invention having a fourth-order ΣΔ modulator 21b equivalent to the ΣΔ modulator 60 in FIG. 3. The fourth-order ΣΔ modulator 21b includes four integrators 13a to 13d, nine differentiators 14a to 14i, and four adders 15a to 15d.

An overflow signal OF1 output by the integrator 13a is provided to the adder 15a via the differentiators 14a, 14b, and 14f as an input signal a. An overflow signal OF2 output by the integrator 13b is provided to the adder 15b via the differentiators 14c and 14g as an input signal d.

An overflow signal OF3 output by the integrator 13c is provided to the adder 15d via the differentiator 14h as an input signal h. An overflow signal OF4 output by the integrator 13d is provided to the adder 15d as an input signal i.

Additionally, the overflow signal OF4 is provided to the adder 15d via the differentiator 14i as an input signal j.

The adder 15d performs the computation (f=h+i+j) by adding the input signals h, i, and j and provides an input signal f indicating the result thus obtained to the differentiator 14d and the adder 15b. An output signal of the differentiator 14d is provided to the adder 15b as an input signal g. The adder 15b performs the computation (b=d+f+g) by adding the input signals d, f, and g, and provides an input signal b indicating the result thus obtained to the adder 15a and the differentiator 14e. The adder 15a performs the computation (a+b−c) by adding the input signals a and b and subtracting the input signal c, and provides a signal indicating the result thus obtained to the adder 15c.

Accordingly, the adders 15a, 15b, and 15d perform the following adding operation:

(+1)a+(+1)b+(−1)c+(+1)d+(−1)f+(+1)g+(+1)h+(−1)i+(−1)j.

In the comparison frequency divider 4, the frequency division ratio is modulated based on the computation value obtained with respect to the predetermined fixed frequency division ratio N and output from the adder 15c, and consequently fractional-N operation is implemented.

Incidentally, in the conventional fourth-order ΣΔ modulator, the adder 15b subtracts the output signal of the differentiator 14*d* and the adder 15*d* subtracts the output signal of the differentiator 14*i*.

Figure 9:
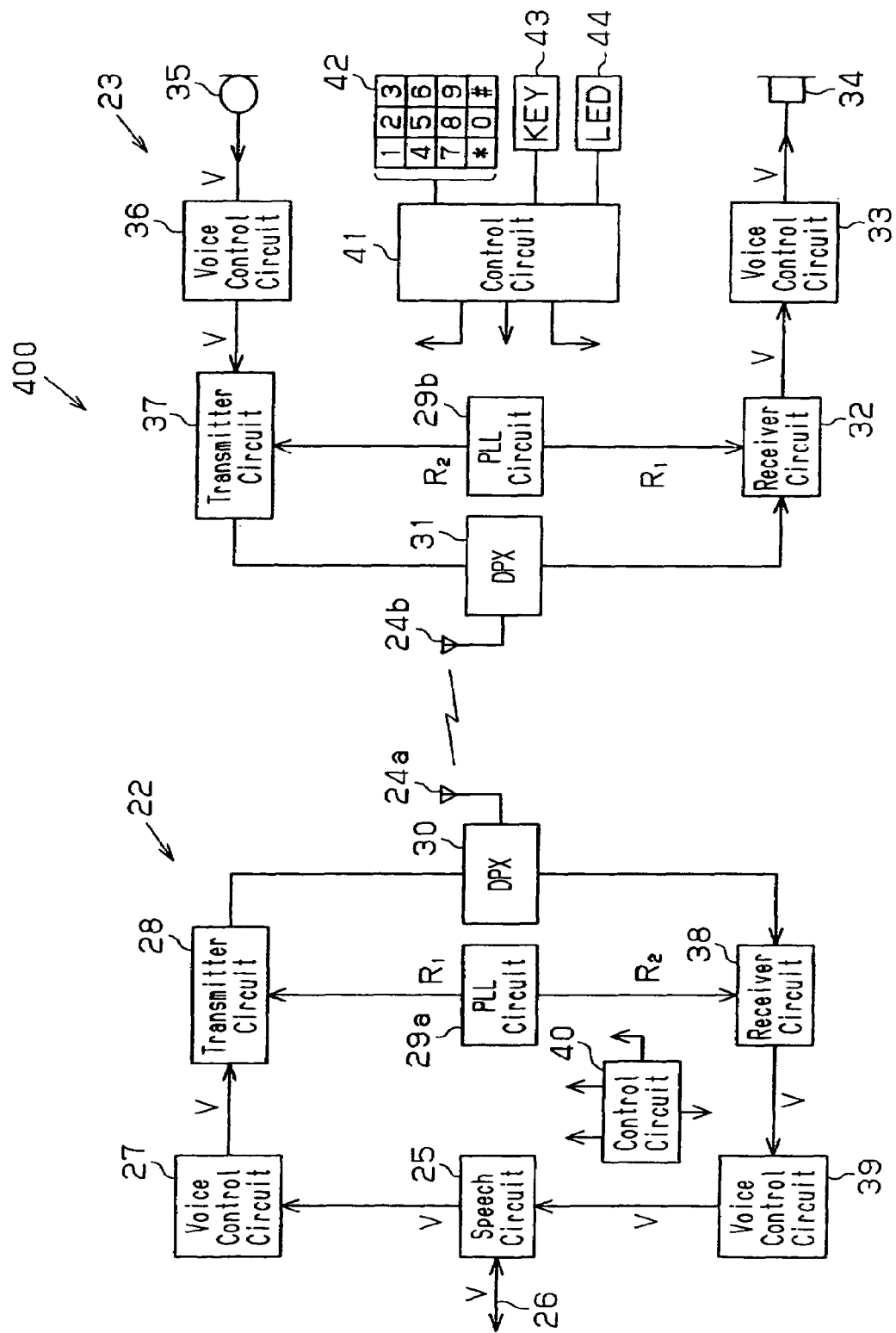
FIG. 9 is a schematic block diagram showing a mobile communication apparatus including a PLL frequency synthesizer shown in FIG. 1, FIG. 3, FIG. 7, or FIG. 8.

The ΣΔ fractional-N PLL frequency synthesizer 200 or 300 is applicable to a mobile communication system 400 as shown in FIG. 9.

The mobile communication system 400 includes a base station 22 and a mobile station 23 such as a car phone or a cellular phone. Communication is conducted between the base station 22 and the mobile station 23 through a wireless line via antennas 24*a* and 24*b*.

The base station 22 is connected to a public telephone network at a speech circuit 25 thereof through a communication line 26. A voice signal V transmitted to the base station 22 through the communication line 26 is transferred to a transmitter circuit 28 via the speech circuit 25 and a voice control circuit 27.

The transmitter circuit 28 is provided with a wireless carrier wave R1 having a predetermined frequency by a PLL circuit 29*a*. The transmitter circuit 28 modulates the voice signal V using the wireless carrier wave R1 with a predetermined method and transmits a modulation signal onto a wireless line via a distributor 30 and the antenna 24*a*.

The PLL circuit 29*a* is configured by the ΣΔ fractional-N PLL frequency synthesizer 200 in FIG. 1 or FIG. 7, or the ΣΔ fractional-N PLL frequency synthesizer 300 in FIG. 3 or FIG. 8.

A control circuit 40 controls the speech circuit 25, the transmitter circuit 28, the PLL circuit 29*a*, and a receiver circuit 38.

On the mobile station 23 side, the modulation signal transmitted on the wireless line is received by a receiver circuit 32 via the antenna 24*b* and a distributor 31.

The receiver circuit 32 demodulates the modulation signal using the wireless carrier wave R1 provided by the PLL circuit 29*b* to produce a voice signal V. A voice control circuit 33 receives the voice signal V from the receiver circuit 32 and outputs the same to a receiver 34.

The PLL circuit 29*b* is configured by the ΣΔ fractional-N PLL frequency synthesizer 200 or 300.

A control circuit 41 controls a transmitter circuit 37, the PLL circuit 29*b*, and the receiver circuit 32. The control circuit 41 controls these circuits and drives a display device (LED) 44 in response to an input signal from a numeric keypad 42 or a function key (KEY) 43.

A voice signal V input through a microphone 35 of the mobile station 23 is transferred to a transmitter circuit 37 via a voice control circuit 36. The transmitter circuit 37 modulates the voice signal V using a wireless carrier wave R2 provided by the PLL circuit 29*b* with a predetermined modulation method, and transmits a modulation signal onto a wireless line via the distributor 31 and the antenna 24*b*.

On the base station 22 side, the modulation signal transmitted on the wireless line is received by the receiver circuit 38 via the antenna 24*a* and the distributor 30. The receiver circuit 38 demodulates the modulation signal using the wireless carrier wave R2 provided by the PLL circuit 29*a* to produce a voice signal V. The voice control circuit 39 receives the voice signal V from the receiver circuit 38 and outputs the same onto the communication line 26 via the speech circuit 25.

Communication is conducted between the mobile station 23 and the base station 22 in this manner so that conversation is enabled between the mobile station 23 and another mobile station via the public telephone network.

The ΣΔ fractional-N PLL frequency synthesizers 200 and 300 according to the first and second embodiments, and the PLL circuit 29*a* and 29*b* and mobile communication system 400 employing the ΣΔ fractional-N PLL frequency synthesizer 200 or 300 provides the advantages as described below.

(1) Fractional-N operation can be carried out by the comparison frequency divider 4 on the basis of output signals from the ΣΔ modulators 50, 60, 21*a*, and 21*b*. This enables the reference signal fr to have a higher frequency, and hence the channel switching speed, that is the lock-up speed for an output signal fvco of the PLL circuit can be increased, and the C/N characteristics can be improved.

(2) The width of variation of random numbers obtained by computation of the ΣΔ modulator can decrease while increasing the order of the ΣΔ modulators 50, 60, 21*a*, and 21*b*. As a result, the modulation width in the comparison frequency divider 4 can be decreased to reduce the noise level of the PLL circuit output signal fvco, and the C/N characteristics can be improved.

(3) The order of the ΣΔ modulators 50, 60, 21*a*, and 21*b* can be increased to stabilize the noise level of the PLL circuit output signal.

The present invention may be applied not only to third-order and fourth-order ΣΔ modulators but also to fifth- or higher-order ΣΔ modulators.

Further, the ΣΔ fractional-N PLL frequency synthesizer 200 or 300 according to the present invention may be employed for either the PLL circuit 29*a* of the base station 22 or the PLL circuit 29*c* of the mobile station 23.

The present examples and embodiments are to be considered as illustrative and not restrictive, and the invention is not to be limited to the details given herein, but may be modified within the scope and equivalence of the appended claims.

What is claimed is:

1. A ΣΔ modulator for producing a modulation signal for modulating a frequency division ratio of a comparison frequency divider of a PLL circuit, the ΣΔ modulator comprising:

an adder for producing random numbers for modulating the frequency division ratio of the comparison frequency divider as the modulation signal, wherein the adder produces the random numbers to decrease the modulation width of the frequency division ratio.

2. A ΣΔ modulator for producing a modulation signal for modulating a frequency division ratio of a comparison frequency divider of a PLL circuit, the ΣΔ modulator comprising:

an adder for producing random numbers for modulating the frequency division ratio of the comparison frequency divider by addition processing of input signals according to a predetermined operational logic, wherein the operational logic is set to decrease the modulation width of the frequency division ratio.

3. A ΣΔ modulator for producing a modulation signal for modulating a frequency division ratio of a comparison frequency divider of a PLL circuit, the ΣΔ modulator comprising:

a plurality of integrators connected in series, each of which integrates an input signal and outputs an overflow signal when its integrated value has exceeded a predetermined value;

a plurality of differentiators connected selectively to the plurality of integrators, each of the differentiators transferring the overflow signal of its associated integrator; and an adder for producing the modulation signal by multiplying a predetermined coefficient by the overflow signals transferred from the plurality of differentiators and adding the multiplied values thus obtained, wherein the predetermined coefficient is set to decrease the modulation width of the frequency division ratio.

4. The ΣΔ modulator according to claim 3, wherein the absolute value of the predetermined coefficient is set to be less than a predetermined value.

5. The ΣΔ modulator according to claim 4, wherein the ΣΔ modulator is a third-order ΣΔ modulator having three integrators, and the predetermined value is 2.

6. The ΣΔ modulator according to claim 4, wherein the ΣΔ modulator is a fourth-order ΣΔ modulator having four integrators, and the predetermined value is 4.

7. A ΣΔ modulator for producing a modulation signal for modulating a frequency division ratio of a comparison frequency divider of a PLL circuit, the ΣΔ modulator comprising:
- a plurality of integrators connected in series, each of which integrates an input signal and outputs an overflow signal when its integrated value has exceeded a predetermined value;
- a plurality of differentiators selectively connected to the plurality of integrators, each of the differentiators transferring the overflow signal of its associated integrator; and
- a plurality of adders each of which produces the modulation signal by multiplying a predetermined coefficient by the overflow signal transferred from its associated differentiator and adding the multiplied values thus obtained, wherein the predetermined coefficient is set such that the modulation width of the frequency division ratio decreases.

8. The ΣΔ modulator according to claim 7, wherein the absolute value of the predetermined coefficient is set to be less than a predetermined value.

9. The ΣΔ modulator according to claim 8, wherein the ΣΔ modulator is a third-order ΣΔ modulator having three integrators and the predetermined value is 2.

10. The ΣΔ modulator according to claim 8, wherein the ΣΔ modulator is a fourth-order ΣΔ modulator having four integrators and the predetermined value is 4.

11. A ΣΔ modulator for producing a modulation signal for modulating a frequency division ratio of a comparison frequency divider of a PLL circuit, the ΣΔ modulator comprising:
- N, where N≧, integrators connected in series, each of which integrates an input signal and outputs an overflow signal when its integrated value has exceeded a predetermined value;
- N adders connected in series for producing a computation signal; and
- a plurality of differentiators each of which transfers the overflow signal from its associated integrator or the computation signal from its associated adder, wherein the N adders include:
  - a first stage adder for adding an overflow signal from the Nth-stage integrator, an overflow signal from the differentiator associated with the Nth stage integrator, and an overflow signal from the differentiator associated with the (N−1)th stage integrator;
  - second to (N−2)th stage adders for adding a computation signal from the previous stage adder, a computation signal transferred from the previous stage adder via a differentiator, and overflow signals transferred from differentiators associated with the (N−2)th to second stage integrators;
  - an (N−1)th stage adder for adding a computation signal from the previous stage adder and an overflow signal transferred from the differentiator associated with the first stage integrator, and subtracting a computation signal transferred from the previous stage adder via a differentiator; and
  - an Nth stage adder for adding a computation signal from the (N−1)th stage adder and a fixed frequency division ratio to produce the modulation signal.

12. A ΣΔ modulator for producing a modulation signal for modulating a frequency division ratio of a comparison frequency divider of a PLL circuit, the ΣΔ modulator comprising:
- three integrators connected in series, each of which integrates an input signal and outputs an overflow signal when its integrated value has exceeded a predetermined value;
- three adders connected in series for producing a computation signal; and
- a plurality of differentiators connected to the three integrators and two adders, each of which transfers an overflow signal from its associated integrator or a computation signal from its associated adder, wherein the three adders include:
  - a first adder for adding an overflow signal from the first integrator, an overflow signal transferred from the differentiator associated with the first integrator, and an overflow signal transferred from the differentiator associated with a second integrator;
  - a second adder for adding a computation signal from the first adder and an overflow signal transferred from the differentiator associated with a third integrator, and subtracting a computation signal transferred from the first adder via a differentiator; and
  - a third adder for adding a computation signal from the second adder and a fixed frequency division ratio to produce the modulation signal.

13. A ΣΔ modulator for producing a modulation signal for modulating a frequency division ratio of a comparison frequency divider of a PLL circuit, the ΣΔ modulator comprising:
- four integrators connected in series, each of which integrates an input signal and outputs an overflow signal when its integrated value has exceeded a predetermined value;
- four adders connected in series for producing a computation signal; and
- a plurality of differentiators each of which transfers an overflow signal from its associated integrator or a computation signal from its associated adder; wherein the four adders include:
  - a first adder for adding an overflow signal from the first integrator, an overflow signal transferred from the differentiator associated with a first integrator, and an overflow signal transferred from the differentiator associated with a second integrator;
  - a second adder for adding a computation signal from the first adder, a computation signal transferred from the first adder via a differentiator, and an overflow signal transferred from the differentiator associated with a third integrator;
  - a third adder for adding the computation signal from the second adder and an overflow signal transferred from the differentiator associated with a fourth integrator, and subtracting a computation signal transferred from the second adder via a differentiator; and
  - a fourth adder for adding a computation signal from the third adder and a fixed frequency division ratio to produce the modulation signal.

14. A PLL circuit comprising:
a comparison frequency divider for performing a fractional-N operation according to a modulation signal;
a ΣΔ modulator connected to the comparison frequency divider, for producing the modulation signal, wherein the ΣΔ modulator includes an adder for producing random numbers for performing a fractional-N operation of the comparison frequency divider as the modulation signal, wherein the adder produces the random numbers to decrease the modulation width of the frequency division ratio.

15. A fractional-N PLL frequency synthesizer comprising:
a comparison frequency divider for performing a fractional-N operation according to a modulation signal;
a ΣΔ modulator connected to the comparison frequency divider, for producing the modulation signal, the ΣΔ modulator including an adder for producing random numbers for performing a fractional-N operation of the comparison frequency divider as the modulation signal, the adder producing the random numbers to decrease the modulation width of the frequency division ratio;
a reference frequency divider for producing a reference signal; and
a phase comparator connected to the comparison frequency divider and the reference frequency divider for comparing the reference signal and the comparison signal to produce a phase comparison signal.

16. A base station for a mobile communication system for performing wireless communication with a mobile station, the base station comprising:
a transmitter circuit for modulating a signal to be transmitted to the mobile station using a wireless carrier wave signal to produce a modulated transmission signal;
a receiver circuit for demodulating a modulated signal received from the mobile station using the wireless carrier wave signal to produce a reception signal; and
a PLL circuit connected to the transmitter circuit and the receiver circuit for producing the wireless carrier wave signal, the PLL circuit including a fractional-N PLL frequency synthesizer, the frequency synthesizer including:
a comparison frequency divider for receiving the wireless carrier wave signal and performing a fractional-N operation according to a modulation signal to produce a comparison signal;
a ΣΔ modulator connected to the comparison frequency divider, for producing the modulation signal, the ΣΔ modulator including an adder for producing random numbers for performing a fractional-N operation of the comparison frequency divider as the modulation signal, the adder producing the random numbers to decrease the modulation width of the frequency division ratio;
a reference frequency divider for producing a reference signal; and
a phase comparator connected to the comparison frequency divider and the reference frequency divider for comparing the reference signal and the comparison signal to produce a phase comparison signal.

17. A mobile station for a mobile communication system for performing wireless communication with a base station, the mobile station comprising:
a transmitter circuit for modulating a signal to be transmitted to the base station using a wireless carrier wave signal to produce a modulated transmission signal;
a receiver circuit for demodulating the modulated signal received from the base station to produce a reception signal; and
a PLL circuit connected to the transmitter circuit and the receiver circuit for producing the wireless carrier wave signal, the PLL circuit including a fractional-N PLL frequency synthesizer, the frequency synthesizer including:
a comparison frequency divider for receiving the wireless carrier wave signal and performing a fractional-N operation according to a modulation signal to produce a comparison signal;
a ΣΔ modulator connected to the comparison frequency divider, for producing the modulation signal, the ΣΔ modulator including an adder for producing random numbers for performing a fractional-N operation of the comparison frequency divider as the modulation signal, the adder producing the random numbers to decrease the modulation width of the frequency division ratio;
a reference frequency divider for producing a reference signal; and
a phase comparator connected to the comparison frequency divider and the reference frequency divider for comparing the reference signal and the comparison signal to produce a phase comparison signal.

18. A mobile communication system comprising:
a base station; and
a mobile station capable of performing wireless communication with the base station, at least one of the base station and mobile station including a fractional-N PLL frequency synthesizer, the frequency synthesizer including:
a comparison frequency divider for performing a fractional-N operation according to a modulation signal to produce a comparison signal;
a ΣΔ modulator connected to the comparison frequency divider, for producing the modulation signal, the ΣΔ modulator including an adder for producing random numbers for performing a fractional-N operation of the comparison frequency divider as the modulation signal, the adder producing the random numbers to decrease the modulation width of the frequency division ratio;
a reference frequency divider for producing a reference signal; and
a phase comparator connected to the comparison frequency divider and the reference frequency divider for comparing the reference signal and the comparison signal to produce a phase comparison signal.

* * * * *

UNITED STATES PATENT AND TRADEMARK OFFICE
CERTIFICATE OF CORRECTION

| | | |
|---|---|---|
| PATENT NO. | : 7,388,438 B2 | Page 1 of 1 |
| APPLICATION NO. | : 11/042136 | |
| DATED | : June 17, 2008 | |
| INVENTOR(S) | : Morihito Hasegawa | |

It is certified that error appears in the above-identified patent and that said Letters Patent is hereby corrected as shown below:

On the Title Page -

Insert the following:

-- In the  RELATED U.S. APPLICATION DATA

Item (63)  Continuation of Application No. PCT/JP02/13701, filed on December 26, 2002 --

Signed and Sealed this

Tenth Day of February, 2009

JOHN DOLL
*Acting Director of the United States Patent and Trademark Office*